(12) United States Patent
Kim et al.

(10) Patent No.: US 9,709,710 B2
(45) Date of Patent: Jul. 18, 2017

(54) DEVICE INCLUDING LIGHT BLOCKING LAYER AND METHOD OF PATTERNING THE LIGHT BLOCKING LAYER

(71) Applicant: Samsung SDI Co., Ltd., Yongin-si (KR)

(72) Inventors: Sang-Soo Kim, Suwon-si (KR);
Jin-Hee Kang, Suwon-si (KR);
Chan-Woo Kim, Suwon-si (KR);
Ho-Jeong Paek, Suwon-si (KR);
Bum-Jin Lee, Suwon-si (KR);
Sung-Seo Cho, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 14/940,337

(22) Filed: Nov. 13, 2015

(65) Prior Publication Data
US 2016/0259095 A1 Sep. 8, 2016

(30) Foreign Application Priority Data

Mar. 6, 2015 (KR) .................... 10-2015-0031650
Sep. 10, 2015 (KR) .................... 10-2015-0128444

(51) Int. Cl.
*H01L 27/15* (2006.01)
*G02B 5/00* (2006.01)
*H01L 29/786* (2006.01)
*H01L 27/12* (2006.01)

(52) U.S. Cl.
CPC .......... *G02B 5/003* (2013.01); *H01L 27/1214* (2013.01); *H01L 29/78633* (2013.01)

(58) Field of Classification Search
None
See application file for complete search history.

(56) References Cited

U.S. PATENT DOCUMENTS

| 6,583,830 B2 * | 6/2003 | Yasukawa ......... G02F 1/136209 |
| | | 349/111 |
| 7,476,476 B2 | 1/2009 | Suwa |
| 2006/0020068 A1 | 1/2006 | Elce et al. |

(Continued)

FOREIGN PATENT DOCUMENTS

| JP | 07-084122 A | 3/1995 |
| JP | 2006-350029 A | 12/2006 |

(Continued)

OTHER PUBLICATIONS

Search Report in counterpart Taiwanese Application No. 104136566 dated Apr. 6, 2016, pp. 1.

*Primary Examiner* — Sitaramarao S Yechuri
(74) *Attorney, Agent, or Firm* — Additon, Higgins & Pendleton, P.A.

(57) ABSTRACT

A device includes a substrate; a light blocking layer on the substrate; a passivation film covering the light blocking layer on the substrate; a thin film transistor on the passivation film; another passivation film covering the thin film transistor; a color filter on the another passivation film; and an insulation layer on the another passivation film and covering the color filter, wherein the light blocking layer is patterned using a composition including a heat resistance polymer, a cross-linking agent, a black colorant, and a solvent. A method of patterning the light blocking layer is also provided.

16 Claims, 2 Drawing Sheets

(56) References Cited

U.S. PATENT DOCUMENTS

| | | | |
|---|---|---|---|
| 2009/0202822 A1* | 8/2009 | Hasegawa | C08J 7/047 |
| | | | 428/339 |
| 2010/0060830 A1* | 3/2010 | Yamada | B32B 27/285 |
| | | | 349/96 |
| 2011/0147757 A1* | 6/2011 | Kim | H01L 29/78633 |
| | | | 257/71 |
| 2011/0278720 A1* | 11/2011 | Nakano | H01L 23/3171 |
| | | | 257/737 |
| 2012/0033151 A1* | 2/2012 | Toyotaka | G02F 1/134336 |
| | | | 349/43 |
| 2012/0183751 A1 | 7/2012 | Katayama et al. | |
| 2012/0285929 A1* | 11/2012 | Matsumura | B44C 1/22 |
| | | | 216/49 |
| 2012/0318854 A1 | 12/2012 | Tsang et al. | |
| 2013/0280655 A1* | 10/2013 | Higashihara | C08G 14/04 |
| | | | 430/270.1 |
| 2014/0231729 A1 | 8/2014 | Shiota et al. | |

FOREIGN PATENT DOCUMENTS

| | | |
|---|---|---|
| JP | 2009-222792 A | 10/2009 |
| JP | 4371110 B2 | 11/2009 |
| JP | 4821680 A | 11/2011 |
| JP | 2014-525835 A | 10/2014 |
| JP | 2015-007766 A | 1/2015 |
| KR | 10-2009-0040483 A | 4/2009 |
| KR | 10-2012-0090050 A | 8/2012 |
| KR | 10-2014-0043443 A | 4/2014 |
| KR | 10-2014-0075872 A | 6/2014 |

* cited by examiner

DEVICE INCLUDING LIGHT BLOCKING LAYER AND METHOD OF PATTERNING THE LIGHT BLOCKING LAYER

CROSS-REFERENCE TO RELATED APPLICATION

This application claims priority to and the benefit of Korean Patent Application No. 10-2015-0031650 filed in the Korean Intellectual Property Office on Mar. 6, 2015, and Korean Patent Application No. 10-2015-0128444 filed in the Korean Intellectual Property Office on Sep. 10, 2015, the entire disclosures of which are incorporated herein by reference.

FIELD OF THE INVENTION

This disclosure relates to a device including a light blocking layer and a method of patterning the light blocking layer.

BACKGROUND

A black photosensitive resin composition can be used to manufacture a light blocking layer of a display device for a color filter, a liquid crystal display material, an organic light emitting element (EL), a display panel material, and the like. For example, a color filter such as a color liquid crystal display and the like requires a light blocking layer on the border among colored layers such as red, green, blue, and the like to enhance display contrast and/or chromophore effects. This light blocking layer may be mainly formed of the black photosensitive resin composition. As for a black pigment, carbon black is the most widely used, but RGB-mixed black, a perylene-based compound, cobalt oxide, lactam-based organic black and the like may also be used.

A light blocking layer inside a device such as a display device is patterned through exposing and developing processes. There can be problems associated with the formation of a light blocking layer, such as difficulty in providing a uniform fine pattern. Also, conventional light blocking layers can have low heat and/or chemical resistance. Furthermore, conventional light blocking layers are formed of a negative type black photosensitive resin composition and thus can have a narrow application scope.

Accordingly, an effort to develop a novel method of patterning a light blocking layer for realizing a fine pattern and a device including the light blocking layer has been made.

SUMMARY

One embodiment provides a device including a light blocking layer capable of realizing a fine pattern.

Another embodiment provides a method of patterning the light blocking layer.

One embodiment provides a device including a substrate; a light blocking layer on the substrate; a passivation film covering the light blocking layer on the substrate; a thin film transistor on the passivation film; another passivation film covering the thin film transistor; a color filter on the another passivation film; and an insulation layer on the another passivation film and covering the color filter, wherein the light blocking layer is patterned using a composition including a heat resistance polymer, a cross-linking agent, a black colorant, and a solvent.

The heat resistance polymer may be a polybenzoxazole precursor, polyimide precursor, a novolac resin, a bisphenol A resin, a bisphenol F resin, an acrylate resin, siloxane-based resin or a combination thereof.

The cross-linking agent may include at least one functional group represented by Chemical Formula 1:

[Chemcial Formula 1]

The cross-linking agent may further include at least one functional group selected from functional groups represented by Chemical Formulae 2 to 4:

[Chemical Formula 2]

[Chemical Formula 3]

[Chemical Formula 4]

In Chemical Formulae 3 and 4, $R^2$ and $R^3$ are the same or different and are each independently a hydrogen atom or a substituted or unsubstituted C1 to C10 alkyl group.

The composition may further include a base generating agent.

The base generating agent may be represented by Chemical Formula 5:

[Chemical Formula 5]

In Chemical Formula 5,

X is —$CH_2$— or —NH—,

W is —O— or —S—, n is an integer of 0 or 1, $R^1$ is a hydrogen atom or a substituted or unsubstituted C1 to C10 alkyl group, and $L^1$ is a single bond or a substituted or unsubstituted C1 to C10 alkylene group.

The base generating agent may be represented by one or more of Chemical Formulae 6 to 9:

[Chemical Formula 6]

-continued

[Chemical Formula 7]

[Chemical Formula 8]

[Chemical Formula 9]

In Chemical Formulae 6 to 9,

X is —CH$_2$— or —NH—,

R$^1$ is a hydrogen atom or a substituted or unsubstituted C1 to C10 alkyl group, and

L$^1$ is a single bond or a substituted or unsubstituted C1 to C10 alkylene group.

The base generating agent may include at least one selected from Chemical Formula 10 to Chemical Formula 22:

[Chemical Formula 10]

[Chemical Formula 11]

[Chemical Formula 12]

[Chemical Formula 13]

[Chemical Formula 14]

[Chemical Formula 15]

[Chemical Formula 16]

[Chemical Formula 17]

[Chemical Formula 18]

[Chemical Formula 19]

[Chemical Formula 20]

[Chemical Formula 21]

-continued

[Chemical Formula 22]

The black colorant may be carbon black, aniline black, perylene black, RGB black, cobalt oxide, titanium oxide or a combination thereof.

The composition may include about 5 parts by weight to about 40 parts by weight of the cross-linking agent, about 10 parts by weight to about 200 parts by weight of the black colorant, about 150 parts by weight to about 4000 parts by weight of the solvent, each based on about 100 parts by weight of the heat resistance polymer.

The base generating agent may be included in an amount of about 5 parts by weight to about 40 parts by weight based on about 100 parts by weight of the heat resistance polymer.

The composition may further include an additive selected from malonic acid, 3-amino-1,2-propanediol, a leveling agent, a fluorine-based surfactant, a silicone-based surfactant, a radical polymerization initiator or a combination thereof.

Another embodiment provides a method of patterning a light blocking layer that includes coating a composition including a heat resistance polymer, a cross-linking agent, a black colorant, and a solvent on a substrate to form a composition layer; coating a photoresist on the composition layer followed by heating the same to form a photoresist layer; exposing and developing the resultant photoresist layer; etching the composition layer after the development; stripping the resultant composition layer with a stripper after the etching process; and heating the resultant composition layer after the stripping process.

In the heating process after the stripping process, the heating may be performed at a temperature of about 200° C. to about 600° C.

In the heating process after coating the photoresist on the composition, the heating may be performed at a temperature of about 70° C. to about 160° C.

The stripper may include propylene glycolmonomethylether (PGME), propylene glycolmonomethyletheracetate (PGMEA), ethyllactate (EL), γ-butyrolactone (GBL), tetramethylammoniumhydroxide (TMAH), potassium hydroxide (KOH), dimethylsulfoxide (DMSO), butyldiglycol (BDG), monoethanolamine (MEA), N-methylpyrrolidone (NMP), hydroxydecanoic acid (HDA), catechol, or a combination thereof.

The etching may be wet etching.

Before the etching process after the development, the method may further include a bleaching process.

Before the stripping process after the etching process, the method may further include a bleaching process.

The heat resistance polymer may be a polybenzoxazole precursor, a polyimide precursor, a novolac resin, a bisphenol A resin, a bisphenol F resin, an acrylate resin, siloxane-based resin or a combination thereof.

The cross-linking agent may include at least one of the functional group represented by Chemical Formula 1.

The composition may further include a base generating agent.

The cross-linking agent and the base generating agent are the same as described above.

The black colorant may be carbon black, aniline black, perylene black, RGB black, cobalt oxide, titanium oxide or a combination thereof.

The composition may include about 5 parts by weight to about 40 parts by weight of the cross-linking agent, about 10 parts by weight to about 200 parts by weight of the black colorant, about 150 parts by weight to about 4000 parts by weight of the solvent, each based on about 100 parts by weight of the heat resistance polymer.

The composition may further include an additive selected from malonic acid, 3-amino-1,2-propanediol, a leveling agent, a fluorine-based surfactant, a silicone-based surfactant, a radical polymerization initiator or a combination thereof.

Other embodiments of the present invention are included in the following detailed description.

According to one embodiment, a device can have a different structure from that of a device such as a conventional display device and includes a light blocking layer formed by using a composition including a novel composition. The light blocking layer is patterned through a novel patterning process which can provide a uniform fine pattern, can exhibit heat and/or chemical resistance, and also can be applicable for both negative and positive type compositions.

DETAILED DESCRIPTION

The present invention will be described more fully hereinafter with reference to the accompanying drawings, in which exemplary embodiments of the present invention are shown. This invention may, however, be embodied in many different forms and should not be construed as limited to the exemplary embodiments set forth herein. These exemplary embodiments disclosed in this specification are provided so that this disclosure will satisfy applicable legal requirements.

As used herein, when a specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, the term "substituted" refers to one substituted with a substituent selected from a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

As used herein, when a specific definition is not otherwise provided, the term "hetero" refers to one including at least one heteroatom such as N, O, S and/or P in a chemical formula.

As used herein, when a specific definition is not otherwise provided, the term "C1 to C30 aliphatic organic group" may refer to a C1 to C30 alkyl group, a C2 to C30 alkenyl group, a C2 to C30 alkynyl group, a C1 to C30 alkylene group, a C2 to C30 alkenylene group, or a C2 to C30 alkynylene group, for example a C1 to C20 alkyl group, a C2 to C20 alkenyl group, a C2 to C20 alkynyl group, a C1 to C20 alkylene group, a C2 to C20 alkenylene group, or a C2 to C20 alkynylene group; the term "C3 to C30 alicyclic organic group" may refer to a C3 to C30 cycloalkyl group, a C3 to C30 cycloalkenyl group, a C3 to C30 cycloalkynyl group, a C3 to C30 cycloalkylene group, a C3 to C30 cycloalkenylene group, or a C3 to C30 cycloalkynylene group, for example a C3 to C20 cycloalkyl group, a C3 to C20 cycloalkenyl group, a C3 to C20 cycloalkynyl group, a C3 to C20 cycloalkylene group, a C3 to C20 cycloalkenylene group, or a C3 to C20 cycloalkynylene group; and the term "C6 to C30 aromatic organic group" may refer to a C6 to C30 aryl group, a C2 to C30 heteroaryl group, a C6 to C30 arylene group, or a C2 to C30 heteroarylene group, for example a C6 to C16 aryl group, a C2 to C16 heteroaryl group, a C6 to C16 arylene group, or a C2 to C16 heteroarylene group.

As used herein, when a specific definition is not otherwise provided, "(meth)acrylate" refers to both "acrylate" and "methacrylate," and "(meth)acrylic acid" refers to "acrylic acid" and "methacrylic acid."

As used herein, when a specific definition is not otherwise provided, the term "combination" refers to mixing or copolymerization.

As used herein, when specific definition is not otherwise provided, "*" indicates a point linked to the same or different atom or chemical formula.

A device according to one embodiment includes a substrate; a light blocking layer on the substrate; a passivation film covering the light blocking layer on the substrate; a thin film transistor on the passivation film; another passivation film covering the thin film transistor; a color filter on the another passivation film; and an insulation layer on the another passivation film and covering the color filter, wherein the light blocking layer is patterned using a composition including a heat resistance polymer, a cross-linking agent, a black colorant, and a solvent.

In general, a device such as a display device and the like includes a light blocking layer to prevent a light leakage phenomenon, and herein, the light blocking layer is patterned through exposing and developing processes. However, the patterning method rarely realizes a uniform fine pattern and brings about low heat and chemical resistance.

Furthermore, the light blocking layer may be formed by using only a negative type composition but rarely by using a positive type composition.

However, a device according to one embodiment includes the light blocking layer formed of a novel composition through a novel patterning process capable of realizing a fine pattern and may use both negative and positive type compositions and may have excellent heat and/or chemical resistance.

The device may be a display device, for example a liquid crystal display, a light emitting diode, a plasma display, or an organic light emitting diode (OLED), but is not limited thereto.

Figure 2:
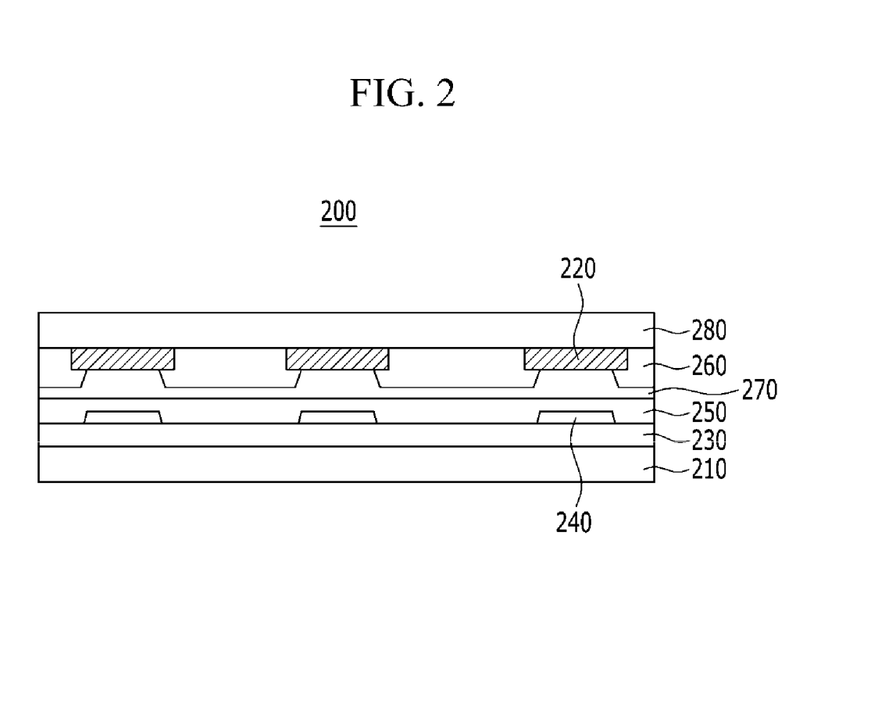
FIG. 2 is a schematic view showing a structure of a conventional display device.
Figure 3:
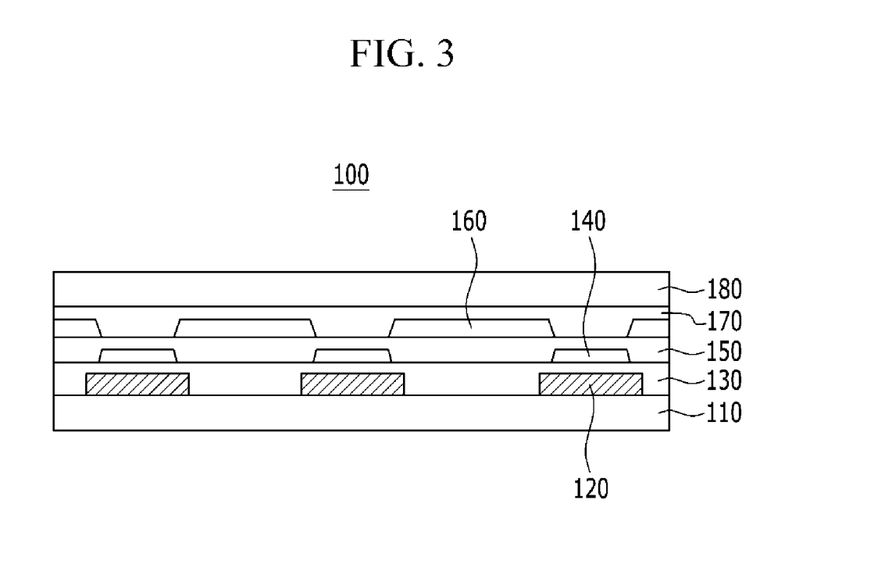
FIG. 3 is a schematic view showing a structure of a device according to one embodiment of the present invention.

FIG. 2 is a schematic view showing the structure of a conventional device (e.g., a display device and the like), and FIG. 3 is a schematic view showing the structure of a device (e.g., a display device and the like) according to one embodiment.

As shown in FIGS. 2 and 3, the conventional mostly includes a thin film transistor 240 right on top of a substrate 210 (or on a passivation film 230 on top of the substrate 210). In contrast, the device 100 according to one embodiment includes a light blocking layer 120 on a substrate 110 and a passivation film 130 covering the light blocking layer 120. Accordingly, the device 100 may realize RGB light through the substrate (e.g., a lower glass side) and may emit the light through the substrate (e.g., the lower glass side) and thus may minimize a space connecting a thin film transistor 140 with PCB, resultantly, obtaining a panel having a reduced bezel or a narrow bezel.

In addition, the device according to one embodiment may further include ITO (not shown).

Hereinafter, each component in the composition for patterning a light blocking layer in a device according to one embodiment may be illustrated in detail.

The composition for patterning a light blocking layer may include a heat resistance polymer. Examples of the heat resistance polymer may include without limitation polybenzoxazole precursors, polyimide precursors, novolac resins, bisphenol A resins, bisphenol F resins, acrylate resins, siloxane-based resins, and the like, and combinations thereof. For example, the heat resistance polymer may be a polybenzoxazole precursor, a polyimide precursor, or a combination thereof.

The polybenzoxazole precursor may include a structural unit represented by Chemical Formula 23, and the polyimide precursor may include a structural unit represented by Chemical Formula 24.

[Chemical Formula 23]

In Chemical Formula 23, $X^1$ is a substituted or unsubstituted C6 to C30 aromatic organic group, and $Y^1$ is a substituted or unsubstituted C6 to C30 aromatic organic group, a substituted or unsubstituted divalent to hexavalent C1 to C30 aliphatic organic group or a substituted or unsubstituted divalent to hexavalent C3 to C30 alicyclic organic group.

[Chemical Formula 24]

In Chemical Formula 24, $X^2$ is a substituted or unsubstituted C6 to C30 aromatic organic group, a substituted or unsubstituted divalent to hexavalent C1 to C30 aliphatic organic group or a substituted or unsubstituted divalent to hexavalent C3 to C30 alicyclic organic group, and

$Y^2$ is a substituted or unsubstituted C6 to C30 aromatic organic group, a substituted or unsubstituted tetravalent to hexavalent C1 to C30 aliphatic organic group or a substituted or unsubstituted tetravalent to hexavalent C3 to C30 alicyclic organic group.

In Chemical Formula 23, $X^1$ is an aromatic organic group that may be a residual group derived aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl) hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane and 2-(3-amino-4-hydroxy-6-trifluoromethylphenyl)-2-(3-hydroxy-4-amino-5-trifluoromethylphenyl)hexafluoropropane, and the like, and combinations thereof.

Examples of $X^1$ may include functional groups represented by Chemical Formulae 25 and/or 26, but are not limited thereto.

[Chemical Formula 25]

[Chemical Formula 26]

In Chemical Formulae 25 and 26, $A^1$ is a single bond, O, CO, $CR^{47}R^{48}$, $SO_2$ or S, $R^{47}$ and $R^{48}$ are the same or different and are each independently a hydrogen atom or a substituted or unsubstituted C1 to C30 alkyl group, for example, C1 to C30 fluoroalkyl group, $R^{50}$ to $R^{52}$ are the same or different and are each independently a hydrogen atom, a substituted or unsubstituted C1 to C30 alkyl group, a substituted or unsubstituted C1 to C30 carboxyl group, a hydroxy group or a thiol group, and n10 is an integer of 0 to 2, and n11 and n12 are the same or different and are each independently an integer of 0 to 3.

In Chemical Formula 23, $Y^1$ may be an aromatic organic group, a divalent to hexavalent aliphatic organic group or a divalent to hexavalent alicyclic organic group that may be a residual group of dicarboxylic acid or a residual group of a dicarboxylic acid derivative. For example, $Y^1$ may be an aromatic organic group or a divalent to hexavalent alicyclic organic group.

Examples of the dicarboxylic acid derivative may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

Examples of $Y^1$ may include one or more functional groups represented by Chemical Formula 27 to Chemical Formula 29, but are not limited thereto.

[Chemical Formula 27]

[Chemical Formula 28]

[Chemical Formula 29]

In Chemical Formulae 27 to 29, $R^{53}$ to $R^{56}$ are the same or different and are each independently a hydrogen atom or a substituted or unsubstituted C1 to C30 alkyl group, n13 and n14 are the same or different and are each independently an integer of 0 to 4, n15 and n16 are the same or different and are each independently an integer of 0 to 3, and $A^2$ is a single bond, O, $CR^{47}R^{48}$, CO, CONH, S or $SO_2$, wherein the $R^{47}$ and $R^{48}$ are the same or different and are each independently a hydrogen atom or a substituted or unsubstituted C1 to C30 alkyl group, for example, a C1 to C30 fluoroalkyl group.

In Chemical Formula 24, $X^2$ may be an aromatic organic group, a divalent to hexavalent aliphatic organic group or a divalent to hexavalent alicyclic organic group. For example, $X^2$ may be an aromatic organic group or a divalent to hexavalent alicyclic organic group.

For example, $X^2$ may be a residual group derived from aromatic diamine, alicyclic diamine or silicon diamine. Herein, the aromatic diamine, alicyclic diamine and silicon diamine may be used singularly or in a mixture of one or more.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis[4-(4-aminophenoxy)phenyl]sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, compounds including aromatic rings thereof substituted with an alkyl group or a halogen, and the like, and combinations thereof.

Examples of the alicyclic diamine may include without limitation 1,2-cyclohexyl diamine, 1,3-cyclohexyl diamine, and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

In Chemical Formula 24, $Y^2$ is an aromatic organic group, a tetravalent to hexavalent aliphatic organic group, or a tetravalent to hexavalent alicyclic organic group. For example, $Y^2$ may be an aromatic organic group or a tetravalent to hexavalent alicyclic organic group.

$Y^2$ may be a residual group derived from aromatic acid dianhydride or alicyclic acid dianhydride. Herein, the aromatic acid dianhydride and the alicyclic acid dianhydride may be used singularly or in a mixture of one or more.

Examples of the aromatic acid dianhydride may include without limitation pyromellitic dianhydride; benzophenone tetracarboxylic dianhydride such as benzophenone-3,3',4,4'-tetracarboxylic dianhydride; oxydiphthalic dianhydride such as 4,4'-oxydiphthalic dianhydride; biphthalic dianhydride such as 3,3',4,4'-biphthalic dianhydride; (hexafluoroisopropylidene)diphthalic dianhydride such as 4,4'-(hexafluoroisopropyledene)diphthalicdianhydride; naphthalene-1,4,5,8-tetracarboxylic dianhydride; 3,4,9,10-perylenetetracarboxylic dianhydride, and the like, and combinations thereof.

Examples of the alicyclic acid dianhydride may include without limitation 1,2,3,4-cyclobutane tetracarboxylic dianhydride, 1,2,3,4-cyclopentane tetracarboxylic dianhydride, 5-(2,5-dioxotetrahydrofuryl)-3-methyl-cyclohexane-1,2-dicarboxylic anhydride), 4-(2,5-dioxotetrahydrofuran-3-yl)-tetralin-1,2-dicarboxylic anhydride, bicyclooctene-2,3,5,6-tetracarboxylic dianhydride, bicyclooctene-1,2,4,5-tetracarboxylic dianhydride, and the like, and combinations thereof.

The heat resistance polymer may have a weight average molecular weight (Mw) of about 3,000 g/mol to about 300,000 g/mol, for example about 5,000 g/mol to about 30,000 g/mol. When the weight average molecular weight (Mw) is within the above range, a sufficient film residue ratio may be obtained in a non-exposed region during the development with an alkali aqueous solution, and patterning may be efficiently conducted.

The composition for patterning a light blocking layer includes across-linking agent, and the cross-linking agent may be a vinyl ether cross-linking agent. For example, the cross-linking agent may include one or more of a functional group represented by Chemical Formula 1:

[Chemical Formula 1]

The cross-linking agent may further include at least one or more functional groups represented by Chemical Formulae 2 to 4 in addition to the functional group represented by Chemical Formula 1.

[Chemical Formula 2]

[Chemical Formula 3]

[Chemical Formula 4]

In Chemical Formulae 3 and 4,

$R^2$ and $R^3$ are the same or different and are each independently a hydrogen atom or a substituted or unsubstituted C1 to C10 alkyl group.

For example, the cross-linking agent may be represented by one or more of Chemical Formulae A to M.

[Chemical Formula A]

-continued

[Chemical Formula B]

[Chemical Formula C]

[Chemical Formula D]

[Chemical Formula E]

[Chemical Formula F]

[Chemical Formula G]

[Chemical Formula H]

[Chemical Formula I]

[Chemical Formula J]

[Chemical Formula K]

[Chemical Formula L]

[Chemical Formula M]

The composition may include the cross-linking agent in an amount of about 5 parts by weight to about 40 parts by weight based on about 100 parts by weight of the heat resistance polymer. In some embodiments, the composition may include the cross-linking agent in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39 or 40 parts by weight. Further, according to some embodiments of the present invention, the amount of the cross-linking agent can be in a range from about any of the foregoing amounts to about any other of the foregoing amounts.

Herein, the cross-linking agent may firm a film and thus can bring about resistance against a solvent and a developing solution and/or can improve a tapered angle and/or heat resistance after curing.

The composition for patterning a light blocking layer includes a black colorant. Examples of the black colorant may include without limitation carbon black, aniline black, perylene black, RGB black, cobalt oxide, titanium oxide, and the like, and combinations thereof. For example, the black colorant may be carbon black.

A dispersing agent may be used therewith to disperse the black colorant. For example, the black colorant may be pretreated with the dispersing agent on the surface or added therewith to prepare the composition.

Examples of the dispersing agent may include without limitation non-ionic dispersing agents, anionic dispersing agents, cationic dispersing agents, and the like, and combinations thereof. Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkylamines, and the like, and these may be used singularly or as a mixture of two or more.

For example, the black colorant may be used as a dispersion solution including the dispersing agent and a post-described solvent, and the dispersion solution may include a solid black colorant, a dispersing agent, and a solvent.

The composition may include the black colorant in an amount of about 10 parts by weight to about 200 parts by weight, for example, about 20 parts by weight to about 150 parts by weight, based on about 100 parts by weight of the heat resistance polymer. In some embodiments, the composition may include the black colorant in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199 or 200 parts by weight. Further, according to some embodiments of the present invention, the amount of the black colorant can be in a range from about any of the foregoing amounts to about any other of the foregoing amounts.

When the black colorant is included in an amount within the above range, excellent coloring effects and/or development performance may be obtained.

The composition for patterning a light blocking layer may further include a base generating agent. The base generating agent may facilitate absorption of an etchant in a film, and patterning time may be adjusted due to the echant.

For example, the base generating agent may be represented by Chemical Formula 5:

[Chemical Formula 5]

In the above Chemical Formula 5,

X is —$CH_2$— or —NH—,

W is —O— or —S—, n is an integer of 0 or 1,

$R^1$ is a hydrogen atom or a substituted or unsubstituted C1 to C10 alkyl group, and $L^1$ is a single bond or a substituted or unsubstituted C1 to C10 alkylene group.

For example, the base generating agent may be represented by one or more of Chemical Formulae 6 to 9.

[Chemical Formula 6]

[Chemical Formula 7]

[Chemical Formula 8]

[Chemical Formula 9]

In Chemical Formulae 6 to 9,

X is —$CH_2$— or —NH—, $R^1$ is a hydrogen atom or a substituted or unsubstituted C1 to C10 alkyl group, and $L^1$ is a single bond or a substituted or unsubstituted C1 to C10 alkylene group.

For example, the base generating agent may include at least one or more selected from Chemical Formula 10 to Chemical Formula 22, but is not limited thereto.

The composition may include the base generating agent in an amount of about 5 parts by weight to about 40 parts by weight, for example 7 parts by weight to about 30 parts by weight, based on about 100 parts by weight of a heat resistance polymer. In some embodiments, the composition may include the base generating agent in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39 or 40 parts by weight. Further, according to some embodiments of the present invention, the amount of the base generating agent can be in a range from about any of the foregoing amounts to about any other of the foregoing amounts.

When the base generating agent is included in an amount within the above range, a pattern may be fast formed down to the bottom without lifting.

The composition for patterning a light blocking layer may include a solvent capable of easily dissolving each component such as a heat resistance polymer, a cross-linking agent, a black colorant, a base generating agent and the like.

The solvent may be an organic solvent. Examples of the solvent may include without limitation N-methyl-2-pyrrolidone, gamma-butyrolactone, N,N-dimethyl acetamide, dimethylsulfoxide, diethyleneglycoldimethylether, diethyleneglycoldiethylether, diethyleneglycoldibutylether, propylene glycolmonomethylether, dipropyleneglycolmonomethylether, propylene glycolmonomethyl ether acetate, methyllactate, ethyl lactate, butyllactate, methyl-1,3-butylene glycolacetate, 1,3-butylene glycol-3-monomethylether, methylpyruvate, ethylpyruvate, methyl-3-methoxypropionate, and the like, and combinations thereof.

The solvent may be appropriately selected depending on a process of forming a photosensitive resin film such as spin coating, slit die coating and the like.

The composition may include the solvent in an amount of about 150 parts by weight to about 4000 parts by weight, for example, about 200 parts by weight to about 3000 parts by weight, based on about 100 parts by weight of a heat resistance polymer. When the solvent is used in an amount within the above range, a film may have a sufficient thickness and also may have excellent solubility and/or coating properties.

The composition for patterning a light blocking layer may further include one or more other additives.

For example, the composition for patterning a light blocking layer may include one or more additives such as but not limited to malonic acid; 3-amino-1,2-propanediol; a coupling agent including a vinyl group or a (meth)acryloxy group; a leveling agent; a fluorine-based surfactant; a silicone-based surfactant; and/or a radical polymerization initiator, for example to prevent stains and/or spots during coating, to adjust leveling, and/or to prevent pattern residue due to non-development. The amount of the additives may be controlled depending on desired properties and can be readily determined by the skilled artisan.

In addition, the composition for patterning a light blocking layer may further include an epoxy compound as an additive to improve a close-contacting (adhesive) force and the like. Examples of the epoxy compound may include without limitation epoxy novolac acrylic carboxylate resins, orthocresol novolac epoxy resins, phenol novolac epoxy resins, tetramethylbiphenyl epoxy resins, bisphenol A epoxy resins, alicyclic epoxy resins, and the like, and combinations thereof.

When the epoxy compound is further included, a radical polymerization initiator such as a peroxide initiator and/or an azobis-based initiator may be further included.

The composition may include the epoxy compound in an amount of about 0.01 parts by weight to about 5 parts by weight based on about 100 parts by weight of the composition for patterning a light blocking layer. When the epoxy compound is used in an amount within the above range, storage capability, economically close-contacting force and other characteristics may be improved.

The composition for patterning a light blocking layer may further include a thermal latent acid generator. Examples of the thermal latent acid generator may include without limitation aryl sulfonic acids such as p-toluenesulfonic acid and/or benzene sulfonic acid; perfluoroalkyl sulfonic acids such as trifluoromethane sulfonic acid and/or trifluorobutane sulfonic acid; alkyl sulfonic acids such as methane sulfonic acid, ethane sulfonic acid, and/or butane sulfonic acid; and the like, and combinations thereof.

Figure 1:
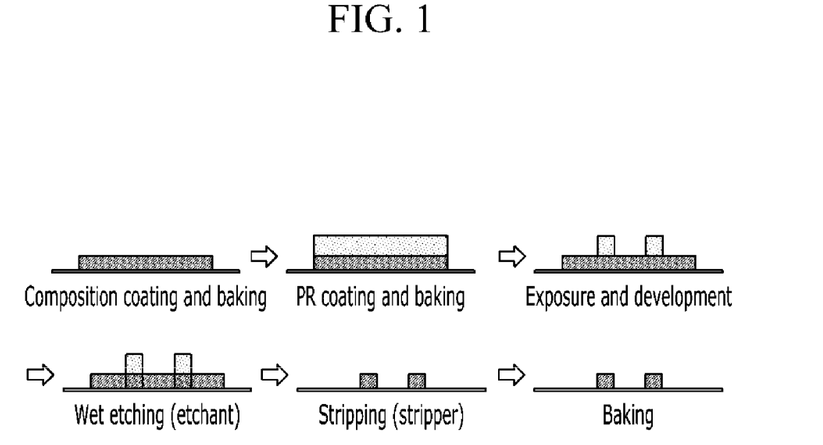
FIG. 1 is a flowchart showing a method of patterning a light blocking layer according to one embodiment of the present invention.

Another embodiment includes a method of patterning a light blocking layer. FIG. 1 is a flowchart showing an exemplary method of patterning a light blocking layer according to one embodiment of the present invention. As shown in FIG. 1, the method can include: coating a composition including a heat resistance polymer, a cross-linking agent, a black colorant, and a solvent on a substrate to form a composition layer; coating a photoresist on the composition layer followed by heating the same to form a photoresist layer; exposing and developing the resultant photoresist layer; etching the composition layer after the development; stripping the resultant composition layer with a stripper after the etching process; and heating the resultant composition layer after the stripping process.

Unlike the conventional method of patterning a light blocking layer, a method of patterning a light blocking layer according to the embodiment may realize a fine pattern through etching and stripping processes after the exposing and developing processes.

In the heating process after the stripping process, the heating may be performed at a temperature of about 200° C. to about 600° C., for example about 220° C. to about 450° C. Conventionally, a post-baking process may be performed at a temperature ranging from about 120° C. to about 240° C. after forming the light blocking layer, but according to the embodiment, a post-baking process may maintain the temperature in a range of about 250° C. to about 600° C., for example, about 300° C. to about 450° C. and thus may reduce out-gas and/or improve heat resistance at a high temperature during a TFT process after forming the light blocking layer.

In the heating process after coating the photoresist on the composition, the heating may be performed at a temperature of about 70° C. to about 160° C., for example, about 80° C. to about 150° C.

Examples of the photoresist may include without limitation novolac-based and/or naphthoquinone diazide-based photoresists. For example, the photoresist may be a chemically amplified resist.

The etching may be wet etching. Herein, an etching solution used during the etching may be acidic.

Examples of the stripper may include without limitation propylene glycolmonomethylether (PGME), propylene glycolmonomethyletheracetate (PGMEA), ethyllactate (EL), γ-butyrolactone (GBL), tetramethylammoniumhydroxide (TMAH), potassium hydroxide (KOH), dimethylsulfoxide (DMSO), butyldiglycol (BDG), monoethanolamine (MEA), N-methylpyrrolidone (NMP), hydroxydecanoic acid (HDA), catechol, and the like, and combinations thereof.

Before the etching process after the development, the method may further include a bleaching process. Or before the stripping processes after the etching process, the method may further include a bleaching process. Herein, the bleaching process may promote dissolution of the photoresist and/or cause a reaction of a photosensitive material in a lower film.

The heat resistance polymer may be a polybenzoxazole precursor, a polyimide precursor, a novolac resin, a bisphenol A resin, a bisphenol F resin, an acrylate resin, siloxane-based resin or a combination thereof. The heat resistance polymer is the same as described above.

The cross-linking agent may include at least one of the functional group represented by Chemical Formula 1. The cross-linking agent is the same as described above.

The composition may further include a base generating agent. The base generating agent is the same as described above.

The black colorant is the same as described above. The black colorant may be carbon black, aniline black, perylene black, RGB black, cobalt oxide, titanium oxide or a combination thereof.

The composition may include about 5 parts by weight to about 40 parts by weight of the cross-linking agent, about 10 parts by weight to about 200 parts by weight of the black colorant, and about 150 parts by weight to about 4000 parts by weight of the solvent, each based on about 100 parts by weight of the heat resistance polymer.

The composition may further include one or more additives, such as but not limited to malonic acid, 3-amino-1,2-propanediol, a leveling agent, a fluorine-based surfactant, a silicone-based surfactant, a radical polymerization initiator or a combination thereof.

Hereinafter, the present invention is illustrated in more detail with reference to examples. These examples, however, are not in any sense to be interpreted as limiting the scope of the invention.

EXAMPLES

Preparation of Heat Resistance Polymer 12.4 g of 2,2-bis(3-amino-4-hydroxy phenyl)-1,1,1,3,3,3-hexafluoropropane are dissolved in 125 g of N-methyl-2-pyrrolidone (NMP) in a four-necked flask equipped with an agitator, a temperature controller, a nitrogen gas injector and a cooler, while nitrogen is passed therethrough.

When the solids are completely dissolved, 4.2 g of pyridine as a catalyst is added thereto, and a solution obtained by dissolving 9.4 g of 4,4'-oxydibenzoylchloride in 100 g of NMP while its temperature is maintained at 0° C. to 5° C. is added into the four-necked flask in a dropwise fashion for 30 minutes. When the addition is complete, the mixture is reacted at 0° C. to 5° C. for one hour and then at room temperature (15° C. to 25° C.) by increasing the temperature for one hour.

Then, 1.1 g of 5-norbornene-2,3-dicarboxyl anhydride is added thereto, and the resulting mixture is agitated at 70° C. for 24 hours, completing the reaction. The reaction mixture is added to a mixed solution of water/methanol=10/1 (a volume ratio) to generate a precipitate, and the precipitate is filtered, cleaned with water, and then dried at 80° C. under vacuum for greater than or equal to 24 hours, obtaining a polybenzoxazole precursor.

Preparation of Composition for Patterning Light Blocking Layer

Example 1

10 g of the polybenzoxazole precursor is added to a mixture of 10 g of γ-butyrolactone (GBL), 140 g of propyleneglycolmonomethylether (PGME), 40 g of ethyllactate (EL) and dissolved therein, 8 g of carbon black and 2.5 g of a cross-linking agent represented by Chemical Formula B are added thereto and dissolved therein, and the solution is filtered through a 0.45 μm fluorine resin filter, obtaining a composition for patterning a light blocking layer.

[Chemical Formula B]

Example 2

A composition for patterning a light blocking layer is prepared according to the same method as Example 1 except for using 2.5 g of a base generating agent represented by Chemical Formula 10 along with the carbon black and the cross-linking agent in Example 1.

[Chemical Formula 10]

Example 3

A composition for patterning a light blocking layer is prepared according to the same method as Example 1 except for using 2.5 g of a base generating agent represented by Chemical Formula 21 along with the carbon black and the cross-linking agent in Example 1.

[Chemical Formula 21]

Comparative Example 1

A composition for patterning a light blocking layer is prepared according to the same method as Example 1 except for using no cross-linking agent in Example 1.

(Evaluation)

Evaluation 1: Chemical Resistance

Each composition for patterning a light blocking layer according to Examples 1 to 3 and Comparative Example 1 is coated on an 8-inch wafer by using a K-Spinner made by SEMES Co. as a spin-coater and heated on a 140° C. hot plate for 3 minutes to form a 1.5 μm-thick light blocking layer. The thickness change of the light blocking layer is examined by dipping the light blocking layer in PGMEA for 1 minute, and the results are provided in the following Table 1.

Reference for Chemical Resistance Evaluation

No thickness change: ○

Thickness change: X

TABLE 1

| | Chemical resistance |
|---|---|
| Example 1 | ○ |
| Example 2 | ○ |
| Example 3 | ○ |
| Comparative Example 1 | X |

As shown in Table 1, the compositions for patterning a light blocking layer according to Examples 1 to 3 have excellent chemical resistance compared with the composition for patterning a light blocking layer according to Comparative Example 1 and thus provides a light blocking layer capable of realizing a fine pattern.

(Evaluation)
Evaluation 2: Pattern Formation and Tapered Angle in Light-Blocking Layer Each composition for patterning a light blocking layer according to Examples 1 to 3 and Comparative Example 1 is coated on an 8 inch wafer by using K-Spinner made by SEMES Co. as a spin-coater and then heated on a 140° C. hot plate for 3 minutes to form a 1.5 μm-thick light blocking layer. Next, the light blocking layer is coated with an i-line PR (HKT-501), the light blocking layer is heated on a 100° C. hot plate for 1 minute, forming a 1.0 μm-thick PR layer. Then, a 5 μm fine pattern is realized by splitting energy with i10C made by Nikon Co. The patterned wafer is exposed and dipped by Al etchant at 30° C. for 300 seconds (with bleaching; 1000 mL/cm²). Accordingly, the final patterned a light blocking layer is made by processing TMAH puddle process for 200 seconds. The patterned (glass) substrate is cured at 350° C. for 1 hour, its tapered angle is measured by using S-4300 made by Hitachi, Ltd., and the results are provided in Table 2.

TABLE 2

| | Formation of pattern | Tapered angle (°) |
| --- | --- | --- |
| Example 1 | ○ | 65 |
| Example 2 | ○ | 64 |
| Example 3 | ○ | 65 |
| Comparative Example 1 | X | — |

As shown in the Table 2, the compositions for patterning a light blocking layer according to Examples 1 to 3 form a pattern having an appropriate tapered angle compared with the composition for patterning a light blocking layer according to Comparative Example 1.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

DESCRIPTION OF SYMBOLS

100, 200: device
110, 180, 210, 280: substrate
120, 220: light blocking layer
130, 150, 230, 250: passivation film
140, 240: thin film transistor
160, 260: color filter
170, 270: insulation layer

What is claimed is:

1. A device comprising
   a substrate;
   a light blocking layer on the substrate;
   a passivation film covering the light blocking layer on the substrate;
   a thin film transistor on the passivation film;
   another passivation film covering the thin film transistor;
   a color filter on said another passivation film; and
   an insulation layer on said another passivation film and covering the color filter,
   wherein the light blocking layer is patterned using a composition including a heat resistance polymer, a cross-linking agent, a black colorant, and a solvent,
   wherein the cross-linking agent comprises at least one functional group represented by Chemical Formula 1:

[Chemical Formula 1]

and
wherein the cross-linking agent further comprises at least one or more functional groups represented by Chemical Formulae 2 to 4:

[Chemical Formula 2]

[Chemical Formula 3]

[Chemical Formula 4]

wherein, in Chemical Formulae 3 and 4,
R² and R³ are the same or different and are each independently a hydrogen atom or a substituted or unsubstituted C1 to C10 alkyl group.

2. The device of claim 1, wherein the heat resistance polymer is a polybenzoxazole precursor, a polyimide precursor, a novolac resin, a bisphenol A resin, a bisphenol F resin, an acrylate resin, siloxane-based resin or a combination thereof.

3. The device of claim 1, wherein the composition further comprises a base generating agent.

4. The device of claim 3, wherein the base generating agent is represented by Chemical Formula 5:

[Chemical Formula 5]

wherein, in Chemical Formula 5,
X is —CH₂— or —NH—,
W is —O— or —S—,
n is an integer of 0 or 1,
R¹ is a hydrogen atom or a substituted or unsubstituted C1 to C10 alkyl group, and
L¹ is a single bond or a substituted or unsubstituted C1 to C10 alkylene group.

5. The device of claim 3, wherein the base generating agent is represented by one or more of Chemical Formulae 6 to 9:

[Chemical Formula 6]

[Chemical Formula 7]

[Chemical Formula 8]

[Chemical Formula 9]

wherein, in Chemical Formulae 6 and 9,

X is —CH$_2$— or —NH—,

R$^1$ is a hydrogen atom or a substituted or unsubstituted C1 to C10 alkyl group, and

L$^1$ is a single bond or a substituted or unsubstituted C1 to C10 alkylene group.

6. The device of claim 3, wherein the base generating agent comprises one or more base generating agents represented by Chemical Formula 10 to Chemical Formula 21:

[Chemical Formula 10]

[Chemical Formula 11]

[Chemical Formula 12]

[Chemical Formula 13]

[Chemical Formula 14]

[Chemical Formula 15]

[Chemical Formula 16]

[Chemical Formula 17]

[Chemical Formula 18]

[Chemical Formula 19]

[Chemical Formula 20]

-continued

[Chemical Formula 21]

7. The device of claim 3, wherein the base generating agent is included in an amount of about 5 parts by weight to about 40 parts by weight based on about 100 parts by weight of the heat resistance polymer.

8. The device of claim 1, wherein the black colorant is carbon black, aniline black, perylene black, RGB black, cobalt oxide, titanium oxide or a combination thereof.

9. The device of claim 1, wherein the composition comprises:
about 5 parts by weight to about 40 parts by weight of the cross-linking agent,
about 10 parts by weight to about 200 parts by weight of the black colorant,
about 150 parts by weight to about 4000 parts by weight of the solvent,
each based on about 100 parts by weight of the heat resistance polymer.

10. The device of claim 1, wherein the composition further comprises malonic acid, 3-amino-1,2-propanediol, a leveling agent, a fluorine-based surfactant, a silicone-based surfactant, a radical polymerization initiator or a combination thereof.

11. A method of patterning a light blocking layer comprising:
coating a composition including a heat resistance polymer, a cross-linking agent, a black colorant, and a solvent on a substrate to form a composition layer;
coating a photoresist on the composition layer followed by heating the same to form a photoresist layer;
exposing and developing the resultant photoresist layer;
etching the composition layer after the development;
stripping the resultant composition layer with a stripper after the etching process; and
heating the resultant composition layer after the stripping process,
wherein the stripper comprises propylene glycol monomethyl ether (PGME), propylene glycol monomethyl ether acetate (PGMEA), ethyl lactate (EL), γ-butyrolactone (GBL), tetramethyl ammonium hydroxide (TMAH), potassium hydroxide (KOH), dimethylsulfoxide (DMSO), butyldiglycol (BDG), monoethanolamine (MEA), N-methylpyrrolidone (NMP), hydroxydecanoic acid (HDA), catechol, or a combination thereof.

12. The method of claim 11, wherein in the heating process after the stripping process, the heating is performed at a temperature of about 200° C. to about 600° C.

13. The method of claim 11, wherein in the heating process after coating the photoresist on the composition layer, the heating is performed at a temperature of about 70° C. to about 160° C.

14. The method of claim 11, wherein before the etching process after the development or before the stripping process after the etching process, the method further comprises a bleaching process.

15. The method of claim 11, wherein the cross-linking agent comprises at least one functional group represented by Chemical Formula 1:

[Chemical Formula 1]

16. The method of claim 11, wherein the composition further comprises a base generating agent.

* * * * *

UNITED STATES PATENT AND TRADEMARK OFFICE
CERTIFICATE OF CORRECTION

PATENT NO. : 9,709,710 B2  
APPLICATION NO. : 14/940337  
DATED : July 18, 2017  
INVENTOR(S) : Sang-Soo Kim et al.

Page 1 of 1

It is certified that error appears in the above-identified patent and that said Letters Patent is hereby corrected as shown below:

In the Specification

Column 8, delete Line 20 and insert: --As shown in FIGS. 2 and 3, the conventional device 200 mostly--

Signed and Sealed this  
Third Day of April, 2018

Andrei Iancu  
*Director of the United States Patent and Trademark Office*